(12) United States Patent
Akselrod et al.

(10) Patent No.: US 8,379,861 B2
(45) Date of Patent: Feb. 19, 2013

(54) INTEGRATED CIRCUIT AND A METHOD FOR SECURE TESTING

(75) Inventors: Dimitri Akselrod, Modi'in (IL); Yossi Amon, Kiryat Tivon (IL); Asaf Ashkenazi, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 463 days.

(21) Appl. No.: 11/719,883

(22) PCT Filed: Nov. 22, 2004

(86) PCT No.: PCT/EP2004/014804
§ 371 (c)(1),
(2), (4) Date: May 18, 2009

(87) PCT Pub. No.: WO2006/053586
PCT Pub. Date: May 26, 2006

(65) Prior Publication Data
US 2009/0296933 A1    Dec. 3, 2009

(51) Int. Cl.
*H04L 9/00* (2006.01)
*H04K 1/00* (2006.01)
*G06F 21/00* (2006.01)

(52) U.S. Cl. ............ 380/277; 380/23; 380/45; 380/287; 713/182

(58) Field of Classification Search .................. 380/3–4, 380/23, 277–280
See application file for complete search history.

(56) References Cited

U.S. PATENT DOCUMENTS

| 5,357,572 | A | * | 10/1994 | Bianco et al. ................. 713/193 |
| 5,530,749 | A | | 6/1996 | Easter et al. |
| 5,704,039 | A | * | 12/1997 | Yishay et al. ................... 726/28 |
| 5,892,900 | A | * | 4/1999 | Ginter et al. .................... 726/26 |
| 5,898,776 | A | | 4/1999 | Apland et al. |
| 6,055,198 | A | | 4/2000 | Tailliet |
| 7,165,180 | B1 | * | 1/2007 | Ducharme .................... 713/182 |
| 7,185,249 | B2 | | 2/2007 | Tkacik et al. |
| 7,725,788 | B2 | | 5/2010 | Tkacik et al. |
| 2003/0177373 | A1 | | 9/2003 | Moyer et al. |
| 2004/0028234 | A1 | * | 2/2004 | Wuidart ........................ 380/287 |
| 2005/0028119 | A1 | * | 2/2005 | Frenkil ............................. 716/6 |
| 2010/0199077 | A1 | | 8/2010 | Case et al. |

FOREIGN PATENT DOCUMENTS

| EP | 0743603 B1 | 10/2002 |
| EP | 743603 B1 * | 10/2002 |

* cited by examiner

*Primary Examiner* — Ashok Patel
*Assistant Examiner* — Evans Desrosiers

(57) ABSTRACT

An integrated circuit that includes a controller and multiple internal circuitries, whereas the integrated circuit is characterized by further including a security mode determination unit that includes multiple one time programmable components for defining a security mode out of multiple possible security modes, whereas a selected circuitry mode affects access to an internal circuitry.

A method for testing an integrated circuit, the method includes: receiving a request to access an internal circuitry; and responding to the request in view of a defined security mode; whereas the method is characterized by a stage of defining a security mode of a debug circuit out of multiple security modes, whereas the definition is responsive to at least a state of multiple one time programmable components.

17 Claims, 4 Drawing Sheets

INTEGRATED CIRCUIT AND A METHOD FOR SECURE TESTING

FIELD OF THE INVENTION

The present invention relates to an integrated circuit and to a method for secure testing of integrated circuits.

BACKGROUND OF THE INVENTION

The complexity of integrated circuits forced designers to use various testing procedures and architectures. One common architecture and protocol is defined at IEEE standard 1149.1 that is also known as JTAG. The IEEE standard 1149.1 defines a test access port (TAP) that may be used to access internal components of an integrated circuit.

JTAG compliant TAPs as well as other debug ports allow unauthorized access to the internal components (such as registers, processors and memories) of integrated circuits.

Various attempts were made for securing integrated circuits. U.S. patent application number 2003/0177373 of Moyer et al., titled "Integrated circuit security and method therefore", which is incorporated herein by reference, describes an integrated circuit that provides a security key base integrated circuit protection scheme.

U.S. Pat. No. 5,898,776 of Apland et al. titled "security antifuse that prevents readout of some but not other information from a programmed filed programmable gate array", which is incorporated herein by reference, describes an antifuse that can be programmed to disable access to a JTAG boundary scan register, while allowing. access to a JTAG bypass register.

An integrated circuit can be tested in various occasions and locations. For example, a prototype of the integrated circuit can be tested during a design or research and development stage, it can be field tested during various evaluation stages, within the manufacturer site, within an Original Equipment Manufacturer site, or even at potential customer sites, and the like.

The security level required from an integrated circuit can vary according to the system or application that makes use of that integrated circuit. For example, smart cards can require a higher security level than other applications.

There is a need to provide an efficient security scheme, and especially a security scheme that can be adjusted according to the various development and marketing stages of integrated circuits and a required security level.

SUMMARY OF THE PRESENT INVENTION

An integrated circuit and a method for testing an integrated circuit, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The following description relates to a certain system on chip and that can operate in four different security modes. It is noted that the invention can be applied within other systems or devices and that security scheme having three, five or more than five security modes can be implemented. It is noted that the integrated circuit can be partitioned to multiple regions, each operating under its own security mode.

Figure 1:
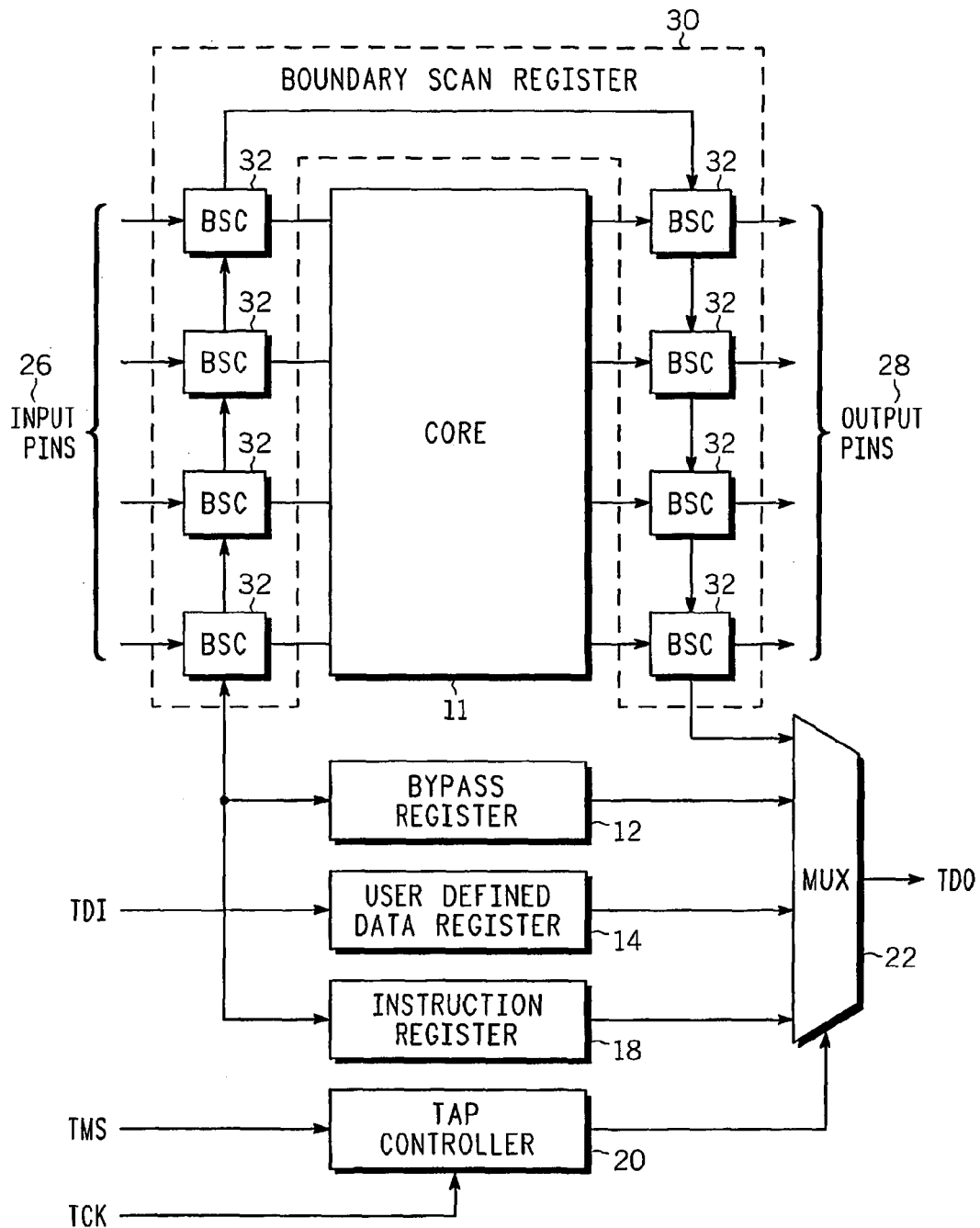
FIG. 1 is a schematic diagram of a prior art TAP and a core.

FIG. 1 illustrates a prior art JTAG compliant test access port (TAP) 10 and a core 11 that is connected to the TAP 10. TAP 10 includes a boundary scan register 30, a one-bit long bypass register 12, an instruction register 18, a TAP controller 20, and an optional user defined data register 14.

TAP 10 receives various signals including a clock signal TCK, a test data input signal TDI, a test mode select signal TMS and outputs a test data output signal TDO.

Various control signals provided by the TAP controller 20, especially in response to TMS signals select a path between the TDI and TDO ports of TAP 10.

The instruction register 18 forms an instruction path while each of the boundary scan register 30, bypass register 12 and the optional user defined data register 14 defines a data path. Each data path and instruction path can be regarded as an internal test path of TAP 10.

Figure 2:
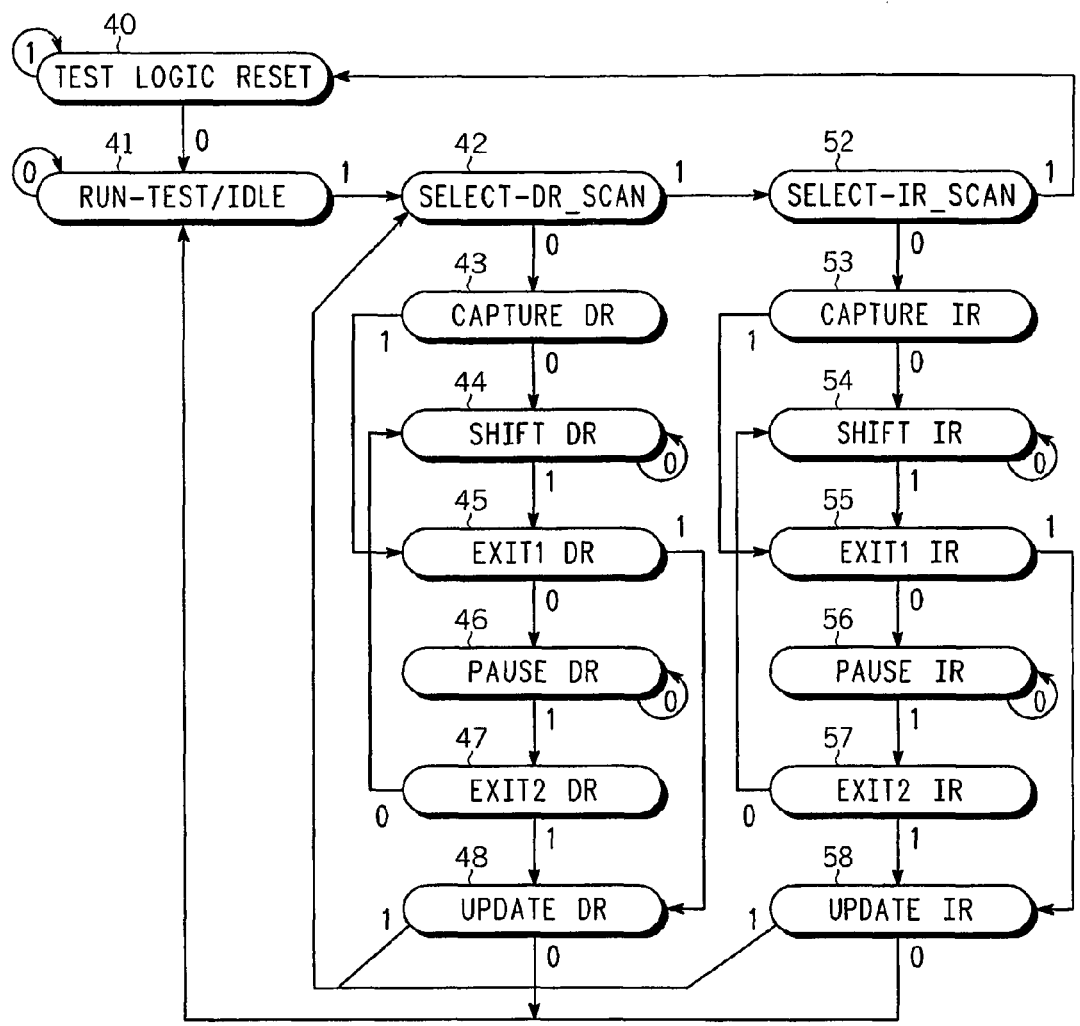
FIG. 2 is a flow chart illustrating various states of a prior art TAP controller.

The TAP controller 20 is a state machine that can apply many stages, including various IEEE standard 1149.1 mandatory states. These mandatory states are controlled by the TMS signal. FIG. 2 illustrates the multiple states of the TAP controller 20: Test logic reset 40, run-test/idle 41, select DR scan 42, capture DR 43, shift DR 44, exit1 DR 45, pause DR 46, exit2 DR 47, update DR 48, select IR scan 52, capture IR 53, shift IR 54, exit1 IR 55, pause IR 56, exit2 IR 57 and update IR 58. The stages are illustrates as boxes that are linked to each other by arrows. The arrows are accompanied by digits (either 0 or 1) that illustrate the value of the TMS signal. These stages are well known in the art and require no further explanation.

Generally, the TAP controller 20 sends control signals that allow to input information into selected data and instruction paths, to retrieve information from said paths and to serially propagate (shift) information along data and instruction paths.

Typically, the instruction register 18 includes an instruction shift register as well as a shadow latch. Signals propagate serially through the instruction shift register and are provided in parallel to the shadow latch.

Figure 3:
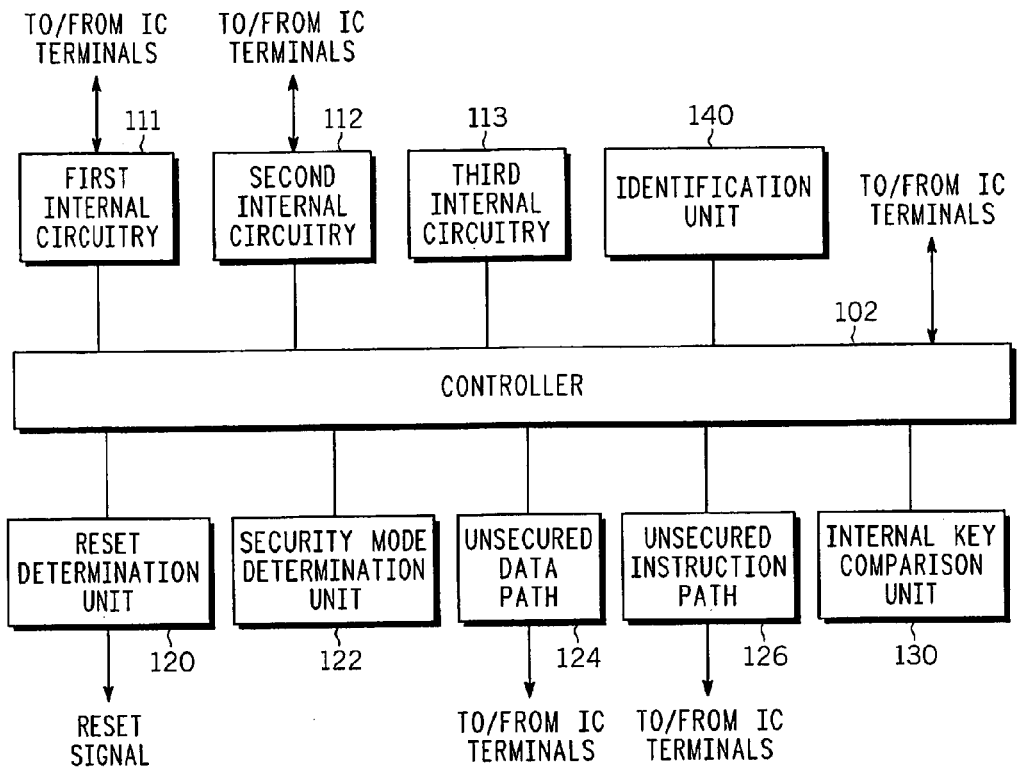
FIG. 3 illustrates a controller and its environment, according to an embodiment of the invention.

FIG. 3 illustrates a controller 102 and its environment, according to an embodiment of the invention. Conveniently, the controller 102 as well as its environment are included within an integrated circuit, such as system on chip (system) 100.

Figure 4:
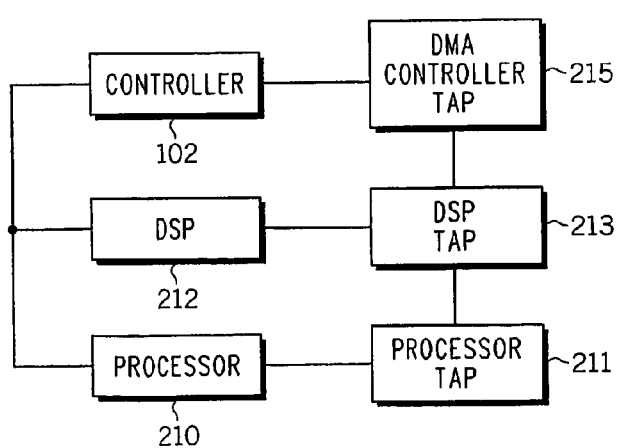
FIG. 4 illustrates a system according to an embodiment of the invention.

FIG. 4 illustrates system 100 according to an embodiment of the invention. System 100 includes a general-purpose processor such as an ARM processor 210 as well as a digital signal processor such as StarCore 140 processor 212. Each processor is connected to a dedicated TAP, such as processor TAP 211 and DSP TAP 213, that are serially connected to a DMA controller TAP 215. Conveniently, the DMA controller TAP 215 can be selectively bypassed by a bypass TAP (not shown).

According to an embodiment of the invention the controller 102 can prevent access to each of said TAPs or processors (or any portion or circuitry of said TAPs and processors), but according to other embodiments of the invention each TAP has its own controller.

Referring back to FIG. 3, controller 102 is connected to multiple internal circuitries (for convenience three internal circuitries 111-113 are illustrated) and can selectively prevent access to one or more of said internal circuitry. These internal circuitries can include registers, memory components, processors, TAPs and the like. Some internal circuitry may be connected directly to the terminals of the integrated circuits, but this is not necessarily so.

According to an embodiment of the invention at least some of the internal circuitries are registers that can be connected to form an internal test path, conveniently between a test data in TDI terminal and a test data output TDO terminal of the integrated circuit.

According to an aspect of the invention the controller 102 determines in which security mode to operate, in various occasions, such as in response to a system reset (boot), upon a reception of a request to access an internal circuitry or upon a request to alter a state of one or more fuses.

Usually, different security modes are associated with different security levels, but this is not necessarily so. The controller 102 learns about the selected security mode by receiving signals from a security mode determination unit 122. The security mode determination unit 122 includes multiple fuses or other irrevocable circuitry components such as one time programmable components that cannot be accessed by hackers. The inventors used electrically programmed fuses and alternatively laser burnt fuses that once burnt (or electrically programmed) cannot be restored.

One time programmable components such as fuses and fuse arrays are known in the art and require no further explanation. Usually multiple cells (such as latches) are serially connected to each other whereas each cell can be connected to a certain voltage potential via a fuse. By burning the fuse the voltage of the cell changes from a first level to another level. The cell sequence is connected to form a shift register that can be read out in a serial or parallel manner. The inventors used a fuse array that includes two hundred and fifty six fuses. Only a small portion of the fuse array was allocated to determine the security mode. According to an aspect of the invention the state of the fuses is read during a reset or boot sequence of the integrated circuit and is stored (or latched) for later retrieval of said information. A portion of the fuse array is further illustrated in FIG. 5. The fuse array is protected from Tap modification.

According to an embodiment of the invention the fuse array 300 (of FIG. 5) includes at least one bypass fuse, such as bypass fuse 310, that can indicate whether to ignore the status of at least one other fuse. The fuses usually also include at least one bypass override fuse, such as bypass override fuse 312, that can indicate whether to ignore the bypass fuse and to be responsive to the status of the previously ignored fuses. This configuration is conveniently used to allow a limited amount of tests without entering a key based security session during a field test. Conveniently, the bypass fuse is burnt prior to performing field return tests, and the bypass override fuse is burnt before the system 100 goes back to the field. In order to access the at least one bypass override fuse the user has to enter a certain security mode. For example if in order to enter this required security mode a user has to successfully pass a key based test then only after passing this test the user can burn the bypass override fuse.

According to another embodiment of the invention the fuse array includes at least one internal component fuse that can be burnt to prevent debugging a certain internal component. The inventors used a dedicated fuse, such as NEXUS interface enable fuse 320, to selectively prevent debugging of a certain Nexus interface. Other dedicates fuses can, for example, prevent access to the boundary scan register, Yet according to another aspect of the invention the debugging circuitry can be activated by software and especially by writing certain codes to a certain register. Thus, the security mode can be determined by an instruction, regardless of the status of the fuse array. It is noted that due to the risks imposed in this option the fuse array includes a software disable fuse, such as software enable fuse 314, that once burnt disables this feature.

For example, if an instruction sets a certain bit SW_JTAG_EN within a certain register (said register can belong to controller 102 or to the security mode determination unit 122) then the status of the fuse array (except from the status of the software enable fuse 320) is ignored of. Conveniently, it is the responsibility of the reset determination unit 120 or of a reset determination software to negate or asserts that bit.

Conveniently, another bit SW_JTAG_LOCK can prevent altering the SW_JTAG EN bit. SW_JTAG_LOCK is sticky bit and is accessed before the trusted reset determination software transfer control to another program. The SW_JTAG_LOCK bit is a write only and can be cleared only when the system 100 is reset. This bit can also be set after the system 100 is reset or when system 100 operates in a non-secure or low security modes.

Referring back to FIG. 3, controller 102 is connected to an identification unit 104 that stores an integrated circuit identification (ID) code. Said ID code can be assigned to one or more integrated circuits. Conveniently this ID code is used during a key based security scheme.

Controller 102 is also connected to a reset determination unit 120. The reset determination unit 120 stores a certain value that is compared to another value that is provided to the reset determination unit 120 only during reset. Thus, reset determination unit 120 determines when a reset occurs. In cases where an external debug device requests to switch from a certain security mode to a less secure security mode the controller 102 may require the user to reset the integrated circuit (or a portion of said integrated circuit).

The reset determination unit 120 can prevent hackers from turning the system 100 on and off or otherwise tampering with the power supplied to system 100 such that erroneous signals are provided to one or more of the components of system 100. This is especially designed to prevent erroneous signals to be provided form the security mode determination unit 122 to be interpreted as allowing an operation at a less secure security mode.

Conveniently, the controller 102 is connected to an unsecured data path 124 and to an unsecured instruction path 126, for receiving data and instructions. The instructions and data can be utilized during the appliance of various security modes. For example, assuming that these paths are a part of a IEEE standard 1149.1 TAP, then the unsecured instruction path may include an instruction register that can receive various instructions such as security output challenge, security enter response, and the like. The insertion of data and instructions via TAPs is known in the art and required no further explanation. An example of using a TAP for a key based security scheme is illustrated in U.S. patent application number 2003/0177373 of Moyer et al, which is incorporated herein by reference.

FIG. 3 illustrates an internal key comparison unit 130 that is a part of the system 100. The controller 102 can initiate a key comparison sequence or may ignore signals from the internal key comparison unit 130, in response to the selected security mode. It is noted that different keys can be associated with different security modes. It is also noted that controller 102 can, additionally or alternatively, be connected to an external key comparison unit.

According to an embodiment of the invention system 100 can operate in different key based security modes. These different security modes may include using a fixed key, using a randomly selected key, using a key provided by a component that is external to the integrated circuit, using a key that is provided by an internal component of system 100, and the like.

Typically, during a fixed key based security mode system 100 provides an ID code to a key generator or key provider that in turn provides a key to the internal key comparison unit 130. The internal key comparison unit 130 also receives a key from an external debug device and compares said keys.

Typically in a randomly selected key scheme system 100 provides an ID code and a random number (the random number can be generated by an internal or external random number generator) to a device that requests access. This device encrypts the random number by the public key of system 100 and sends the encrypted number to system 100. System 100 (or an external component) decrypts the encrypted random number using the private key of system 100. The encrypted random number is compared to the random number and if they equal each other access is granted according to the selected security mode policy.

Conveniently, unsecured data path 124 includes at least a one-bit long bypass register, and may further include additional registers such as an identification register. The unsecured instruction path 126 may include an instruction register that serially receives information via a TDI terminal of system 100 and may also include a decoder. The inventors used a five bit long instruction registers that can support up to thirty two different instructions. These instructions include 1149.1 standard instructions such as IDCODE, SAMPLE.PRELOAD, EXTEST, BYPASS, as well as security related instructions such as security output challenge and security enter response.

According to an embodiment of the invention the internal circuitry includes multiple data registers that are connected between the TDI and TDO terminals of system 100. If controller 102 determines that access to a certain register should be denied than it may prevent said register to output its content to the TDO terminal.

System 100 can operate in four security modes—no debug mode, high security debug mode, low security mode and non-secure mode. In the high security mode the access to various registers is prevented and only few registers can be accessed. These registers include, for example the boundary scan register, power mode register and the like. In the high security mode access to certain internal components is based upon succeeding in a key based security sequence. In the low security mode all JTAG features are enabled. In the non-secure mode even sensitive components such as an encryption module can be debugged.

An internally decided fixed key based security sequence includes the following stages: (i) shifting a security output challenge instruction to the instruction register; (ii) passing through the capture-DR state of the controller 102 by performing shift-DR operations in order to provide an operation challenge code from the TDO terminal of system 100, (typically said code is the ID code of system 100 and the selected register is an ID register); (iii) shifting a security enter response to the instruction register,. whereas the value of the response (certain key) is read from the TDI terminal of system 100 into a certain register that is accessed by or belongs to the internal key comparison unit 130. Once an update DR state is entered the internal key comparison unit 130 compares it internal key to the received key and determines if the requesting debug device can access various internal circuitry.

An internally decided randomly selected key based security scheme includes the following stages: (i) shifting a security output challenge instruction to the instruction register; (ii) passing through the capture-DR state of the controller 102 by performing shift-DR operations in order to provide an operation challenge code from the TDO terminal of system 100, (this operation challenge code is randomly selected or generated by internal key comparison unit 130 or by another dedicated components that generates keys and can receive a response and determine if the response is valid); (iii) shift a security enter response to the instruction register, whereas the value of the response (certain key) is read from the TDI terminal of system 100 into a certain register that is accessed by or belongs to the internal key comparison unit 130. Once an update DR state is entered the internal key comparison unit 130 (or the other dedicated components) determines if it the required response.

Figure 5:
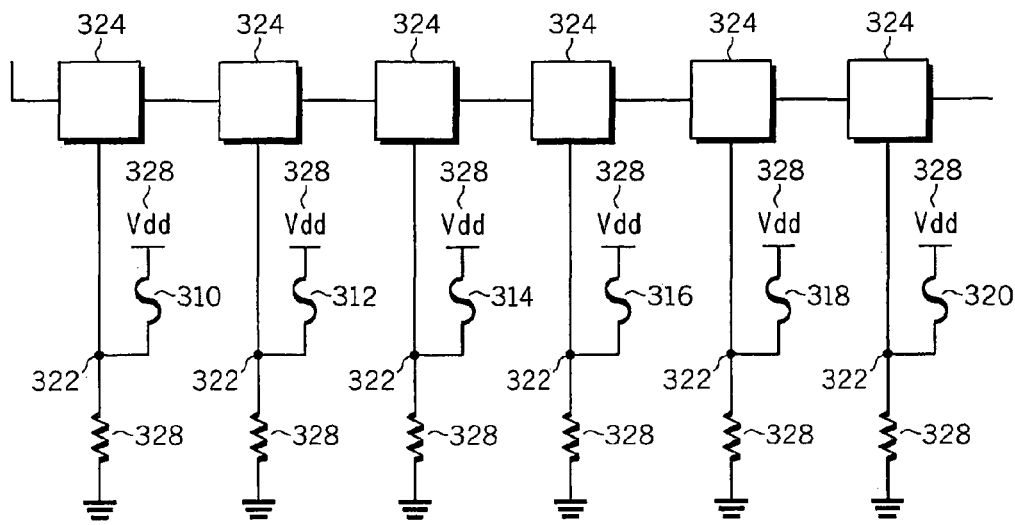
FIG. 5 illustrates various fuses of a fuse array, according to an embodiment of the invention.

FIG. 5 illustrates various fuses of the fuse array 300, according to an embodiment of the invention.

Fuse array 300 includes many fuses, and FIG. 5 only illustrates the following fuses: bypass fuse 310, bypass override fuse 312, software enable fuse 314, security mode fuses 316-318 and NEXUS interface enable fuse 320. Each fuse is connected in one end to a power supply Vdd 328, and is connected at another end to a node 322. That node 322 is connected to a grounded resistor 328 and to a cell 324. Cells 324 are connected in a serial manner to each other, to allow serially reading the status of the different fuses.

Figure 6:
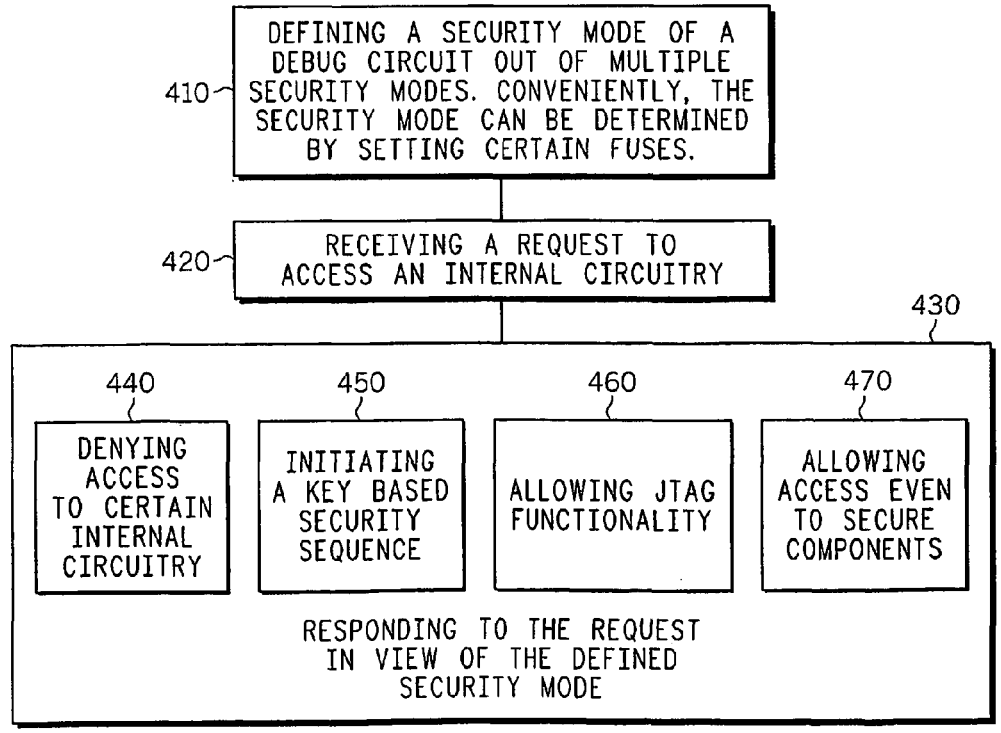
FIG. 6 illustrates a method for testing an integrated circuit, according to an embodiment of the invention.

FIG. 6 illustrates a method 400 for testing an integrated circuit, according to an embodiment of the invention.

The term "testing" refers to debugging, accessing an internal circuitry of the integrated circuit, or retrieving one or more signals representing a status or another property of the integrated circuit or of a portion of said integrated circuit.

Method 400 starts by stage 410 of defining a security mode of a debug circuit out of multiple security modes. Conveniently, the security mode can be determined by setting certain fuses. Alternatively or additionally, the security mode can be set by software.

Stage 410 is followed by a stage 420 of receiving a request to access an internal circuitry. According to an aspect of the invention this request can be initiated by providing appropriate signals to the integrated circuit terminals (such as providing signals such as CLK and TMS to a JTAG compliant TAP). Alternatively or additionally this can be also initiated by software.

Stage 420 is followed by stage 430 of responding to the request in view of the defined security mode.

Stage 430 may include the following stages—stage 440 of denying access to certain internal circuitry, stage 450 of initiating a key based security sequence, stage 460 of allowing JTAG functionality and stage 470 of allowing access even to secure components. These four stages correspond to the four previously mentioned security modes.

According to various embodiments of the invention stage 430 can include other stage, it can include additional stages and even include fewer stages sequences. For example stage 430 may include multiple key based sequence stages, whereas the selection between the various stage sequences is responsive to various parameters including the security mode, the internal circuitry to be accessed and the like.

Conveniently, stage 410 of defining a security mode is response to the software instruction and to a status of a software enable fuse. Conveniently, method 400 includes determining an occurrence of a reset. Said reset determination can assist in determining what is the defined security mode. According to an embodiment of the invention the request to access an internal circuitry is received via a test access port controller, such as but not limited to an IEEE standard 1149.1 compliant test access port.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. An integrated circuit comprising:
a controller;
multiple internal circuitries;
an internal key comparison device; and
a security mode determination device that comprises multiple one time programmable components for defining a security mode out of multiple possible security modes, whereas the selected security mode affects access to the internal circuitries and the multiple possible security modes include a first security mode to deny access to certain internal circuitry, a second security mode to initiate a key based security sequence, a third security mode to allow testing functionality, a fourth security mode to allow access even to secure components, wherein the first security mode, the second security mode, the third security mode, and the fourth security mode are different from each other;
whereas the controller and the security mode determination unit are responsive to an output of a reset determination unit, and wherein the controller requires a user to reset the integrated circuit in response to an external debug device requests a switch from the selected security mode to a less secure security mode, and wherein the controller is adapted to apply multiple key base security modes.

2. The integrated circuit of claim 1 further adapted to define the security mode by software.

3. The integrated circuit of claim 2 further comprising a software enable one time programmable component.

4. The integrated circuit according to claim 1, wherein the controller includes a test access port controller.

5. The integrated circuit according to claim 4 whereas the test access port controller is IEEE standard 1149.1 compliant.

6. A method for testing an integrated circuit, the method comprises:
receiving a request to access an internal circuitry;
responding to the request in view of a defined security mode;
defining a security mode of a debug circuit out of more than two security modes in response to an occurrence of a reset, whereas the definition is responsive to at least a state of multiple one time programmable components, wherein an internal key comparison device is used during one of the security modes, wherein the more than two security modes includes multiple key base security modes;
setting a bit in a register; and
ignoring the state of the multiple one time programmable components in response to the setting of the bit in the register.

7. The method of claim 6 wherein the defining is responsive to a software instruction.

8. The method of claim 7 further defining the security mode in response to the software instruction and to a status of a software enable one time programmable component.

9. The method according to claim 6, whereas the stage of responding comprises initiating a key based security sequence.

10. The method according to claim 6, whereas the stage of responding comprises selecting a key based security scheme out of the multiple key based security schemes.

11. The method according to claim 6, wherein the stage of receiving comprises receiving via a test access port controller.

12. The method according to claim 11 whereas the stage of receiving comprises receiving via a IEEE standard 1149.1 compliant test access port.

13. An integrated circuit comprising:
an internal key comparison unit to compare an external key to a key associated with the security mode;
a security mode determination device that comprises multiple one time programmable components for selecting a security mode from more than two security modes based on a state of the multiple one time programmable components;
a reset determination mode to output a reset signal when the integrated circuit is reset;
a register including first and second bits, wherein the second bit being set prevents a state of the first bit from being altered, and a state of the second bit is cleared in response to the reset signal; and
a controller to determine whether to grant access to internal circuitry of the integrated circuit, in response to receiving the reset signal from the reset determination mode, based on the security mode and the first bit of the register, wherein the controller ignores the security mode and grants access to the internal circuitry when the first bit of the register is set, and wherein the controller is adapted to apply multiple key base security modes.

14. The integrated circuit of claim 13 further adapted to define the security mode by software.

15. The integrated circuit of claim 14 further comprising a software enabled one time programmable component.

16. The integrated circuit according to claim 13, wherein the security mode determination unit is further adapted to apply a different key to each of the more than two security modes.

17. The integrated circuit according to claim 13, wherein the controller includes a test access port controller that is IEEE standard 1149.1compliant.

* * * * *